US009711189B1

(12) United States Patent
Wang et al.

(10) Patent No.: US 9,711,189 B1
(45) Date of Patent: Jul. 18, 2017

(54) ON-DIE INPUT REFERENCE VOLTAGE WITH SELF-CALIBRATING DUTY CYCLE CORRECTION

(75) Inventors: Bonnie I. Wang, San Jose, CA (US); Chiakang Sung, San Jose, CA (US); Xiaobao Wang, San Jose, CA (US); Yan Chong, San Jose, CA (US); Joseph Huang, San Jose, CA (US); Khai Nguyen, San Jose, CA (US); Pradeep Nagarajan, San Jose, CA (US)

(73) Assignee: Altera Corporation, San Jose, CA (US)

( * ) Notice: Subject to any disclaimer, the term of this patent is extended or adjusted under 35 U.S.C. 154(b) by 150 days.

(21) Appl. No.: 13/209,307

(22) Filed: Aug. 12, 2011

(51) Int. Cl.
*G11C 5/14* (2006.01)
*G11C 11/4074* (2006.01)

(52) U.S. Cl.
CPC .......... *G11C 5/147* (2013.01); *G11C 11/4074* (2013.01)

(58) Field of Classification Search
CPC .. G06F 13/1689; G11C 5/147; G11C 11/4074
USPC ............................ 327/108, 170, 530; 326/30
See application file for complete search history.

(56) References Cited

U.S. PATENT DOCUMENTS

| | | | |
|---|---|---|---|
| 5,581,197 A * | 12/1996 | Motley et al. | 326/30 |
| 6,683,482 B2 * | 1/2004 | Humphrey et al. | 327/170 |
| 6,803,820 B1 * | 10/2004 | Muljono | 330/258 |
| 7,113,749 B2 * | 9/2006 | Smith et al. | 455/67.11 |
| 7,940,101 B2 * | 5/2011 | Rai et al. | 327/170 |
| 8,108,738 B2 * | 1/2012 | Gara et al. | 714/700 |
| 8,582,374 B2 * | 11/2013 | Mozak et al. | 365/189.09 |

* cited by examiner

*Primary Examiner* — Lincoln Donovan
*Assistant Examiner* — Colleen O Toole
(74) *Attorney, Agent, or Firm* — Okamoto & Benedicto LLP

(57) ABSTRACT

A buffer circuit with an adjustable reference voltage is presented. The buffer circuit with adjustable reference voltage has an input buffer circuit that is connected to a data input and a reference voltage. The output of the input buffer circuit is connected an eye monitor circuit that generates a transition signal based on a number of transitions of an output of the input buffer circuit. The output from the eye monitor circuit is that processed by a calibration control circuit that transmits a selection signal to a multiplexer. The multiplexer selects a level of the reference voltage based on the selection signal from the calibration control circuit.

12 Claims, 6 Drawing Sheets

ON-DIE INPUT REFERENCE VOLTAGE WITH SELF-CALIBRATING DUTY CYCLE CORRECTION

BACKGROUND

Voltage referenced single-ended input/output (SE I/O) standards used in double data rate (DDR) memory interfaces requires the use of a reference voltage at a receiver circuit. The level of the reference voltage determines the switching point of the buffer circuit of the receiver circuit. The value of the switching point of the buffer circuit can in turn affect the duty cycle of the output of the buffer circuit. With the increasing speed of memory devices, distortion of the duty cycle becomes a significant factor for the performance of the receiver circuit as indicated by the horizontal width of the "eye."

Based on a rule of thumb, the receiver reference voltage level is often set at half of the voltage of the power supply. In practice, the duty cycle of the output of the buffer circuit can be affected by many factors. For example, strength imbalance between the transmitter pull-up transistor and pull-down transistor, the voltage difference between the termination voltage (VTT) and the reference voltage, the offset of the receiver input buffer, etc., can affect the duty cycle of the output of the buffer circuit. Variability in the duty cycle of output of the buffer circuit makes determination of an appropriate value of the reference voltage difficult.

SUMMARY

Broadly speaking, the embodiments provide a method and apparatus for generating a self-compensating reference voltage. In one embodiment, the reference voltage is recursively adjusted based on monitoring a number of transitions made by the input data. It should be appreciated that the embodiments can be implemented in numerous ways, including as a method, a system, or a device. Several exemplary embodiments are described below.

In accordance with one exemplary embodiment, a buffer circuit with a calibrated reference voltage is detailed. The buffer circuit with adjustable reference voltage has an input buffer circuit that is coupled to a data input and a reference voltage. The output of the input buffer circuit is coupled to an eye monitor circuit that generates a set of output signals based on the timing of transitions of an output of the input buffer circuit. The output from the eye monitor circuit is processed by a calibration control circuit that transmits a selection signal to a reference voltage select circuit. The reference voltage select circuit selects a level of the reference voltage based on the selection signal from the calibration control circuit.

In accordance with another exemplary embodiment, a method of generating a continuously calibrated reference voltage is provided. The method begins by receiving input data and generating an output based on the intersection of input data and a reference voltage. A plurality of output versions with varying amount of delay is generated, and each of the delayed output versions of the output is analyzed to detect a transition. The timing of transitions of the output versions is tracked, and the reference voltage is recursively adjusted to identify a level of the reference voltage that minimizes the timing spread of transitions of the output.

Other aspects and advantages will become apparent from the following detailed description, taken in conjunction with the accompanying drawings, illustrating by way of example the principles of the embodiments.

BRIEF DESCRIPTION OF THE DRAWINGS

The embodiments, together with further advantages thereof, may best be understood by reference to the following description taken in conjunction with the accompanying drawings.

DETAILED DESCRIPTION

The following embodiments describe an apparatus and method for generating a self-compensating reference voltage for a buffer circuit. It will be obvious, however, to one skilled in the art, that the embodiments may be practiced without some or all of these specific details. In other instances, well known process operations have not been described in detail in order not to unnecessarily obscure the embodiments.

Voltage referenced, single-ended input/output (SE I/O) standards require the use of a reference voltage. An internally generated reference voltage allows I/O pins normally used for external reference voltages to be used for other purposes. Often the data input signal is shifted due to the termination required by SE I/O standards, which causes the receiver input signal to not have a fixed relation with the receiver power supply. For this reason, the appropriate level of the reference voltage may deviate from a pre-specified voltage related to the power supply voltage. Embodiments described below allow the reference voltage to be determined by the voltage of the input signal rather than the voltage range of the power supply.

Figure 1:
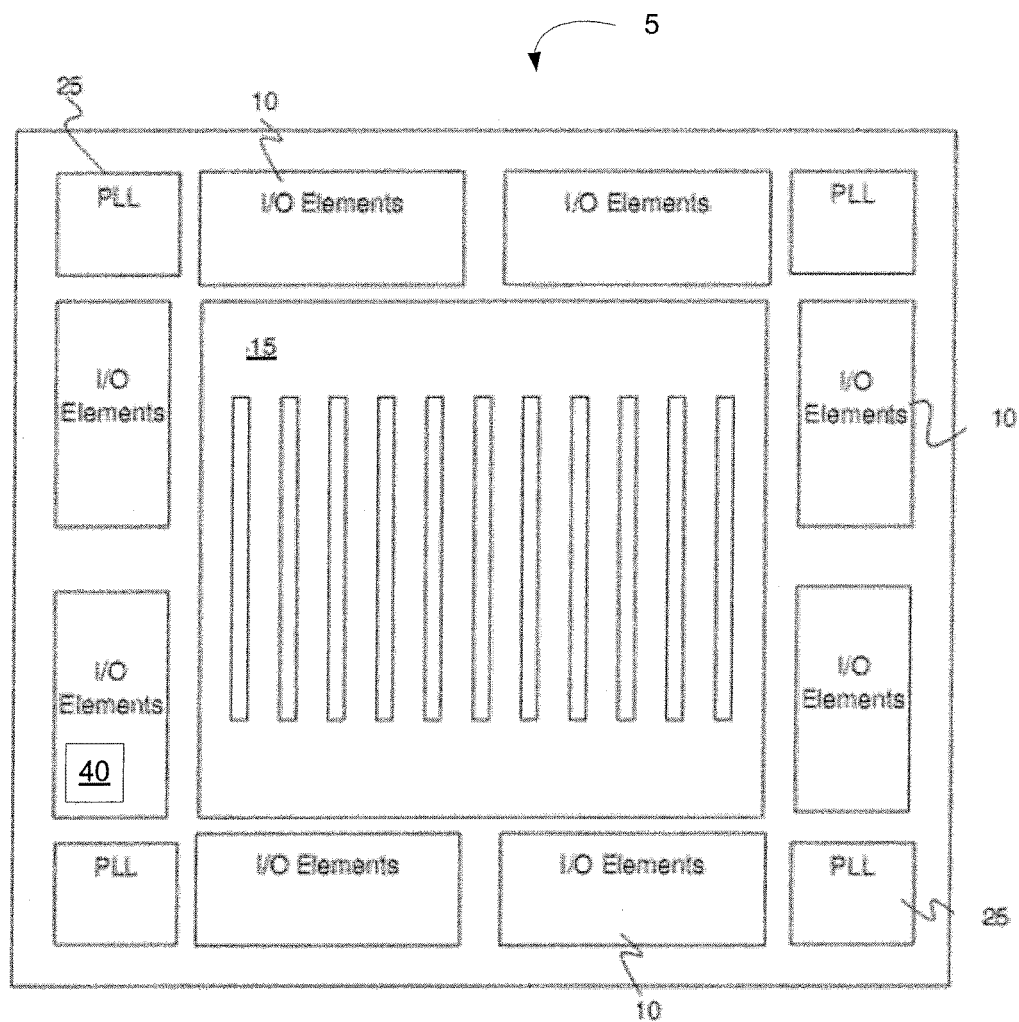
FIG. 1 illustrates a simplified block diagram of a programmable logic device (PLD) that can include aspects of the embodiments.

FIG. 1 illustrates a simplified block diagram of a programmable logic device (PLD) that can include aspects of the embodiments. Programmable logic device 5 includes core logic region 15 and input/output elements 10. Auxiliary circuits such as phase-locked loops (PLLs) 25 for clock generation and timing, can be located outside the core logic region 15, e.g., at corners of the programmable logic device 5 and adjacent to I/O elements 10. It should be appreciated that the embodiments described below can be used in conjunction with known I/O standards, including single ended I/O standards such as high speed transceiver logic (HSTL) or stub series terminated logic (SSTL). In one embodiment, a buffer circuit with an adjustable reference voltage 40 is located within the I/O elements 10 of the PLD 5. Further details of the buffer circuit with an adjustable reference voltage 40 are provided below.

Figure 2:
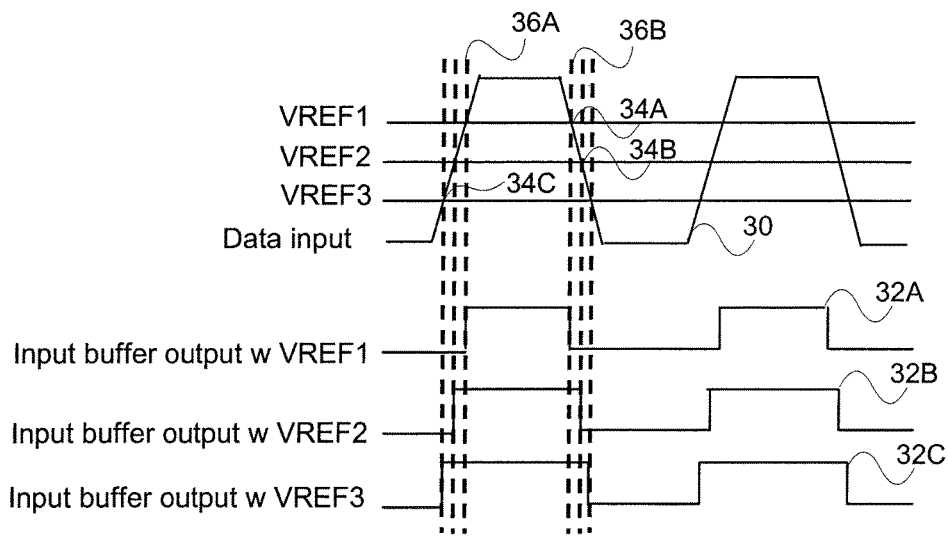
FIG. 2 illustrates exemplary shifting of the output duty cycle in response to adjusting a reference voltage, in accordance with one exemplary embodiment.

FIG. 2 illustrates exemplary shifting of the output duty cycle in response to adjusting a reference voltage, in accordance with one exemplary embodiment. The switching point 34A-C of an input buffer circuit is determined when the voltage of the input data 30 intersects the level of the reference voltage VREF1-3, respectively. The switching point 34A-C of the input buffer in turn determines the duty cycle, i.e., the percentage of the period that the output of the input buffer circuit 32A-C is high. In one example, three exemplary reference voltage levels VREF1-3 produces three different switching points 34A-C, respectively, of the input buffer circuit. The exemplary output waveform 32A of the buffer circuit associated with reference voltage VREF1 has transitions 36A-B that correspond to the low to high 36A transition and high to low transition 36B of the input data 30 crossing the switching point 34A. The exemplary output waveforms 32B-C similarly correspond to low to high and high to low transitions as illustrated. Upon inspection of the exemplary output waveforms 32A-C, it should be appreciated that the switching point 34A-C, as well as the duty cycle of the output of the buffer circuit, varies with the level of the reference voltage VREF1-3, respectively. Embodiments described below enable calibration of the reference voltage to compensate for deviations in the duty cycle of the output of the buffer circuit due to a variety of factors. As discussed above, some of the factors are due to variations in process, voltage, or temperature (PVT), such as transistor strength imbalances or voltage offsets.

Figure 3:
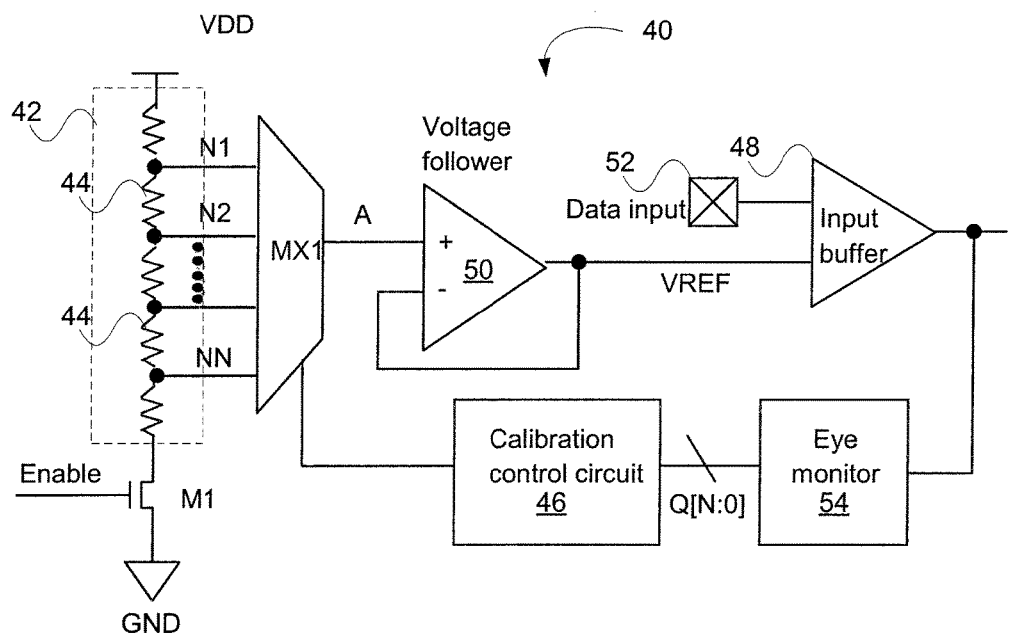
FIG. 3 illustrates an exemplary schematic of a buffer circuit with a calibrated reference voltage, in accordance with one exemplary embodiment.

FIG. 3 illustrates an exemplary schematic of a buffer circuit with an adjustable reference voltage, in accordance with one exemplary embodiment. The buffer circuit with adjustable reference voltage 40 performs self-calibration to determine a level of the reference voltage VREF that yields an appropriate or optimum duty cycle of the output of the input buffer circuit 48. In one embodiment, an optimum duty cycle of the output of the input buffer circuit 48 is a 50% duty cycle, where the signal is high half of the duty cycle and low the other half. Input data is transmitted to the data input 52 of the input buffer 48. The reference voltage VREF is also transmitted to the input buffer circuit 48 through a voltage follower circuit 50. As discussed above in FIG. 2, the output of the input buffer circuit 48 has a transition when the level of the input data crosses the switching point of the input buffer circuit 48. As discussed above in FIG. 2, the switching point is the intersection of the level of the reference voltage VREF and the level of the input data received at the data input 52. The output of the buffer circuit 48 is transmitted to the eye monitor circuit 54. As discussed in further detail below, the eye monitor circuit 54 analyzes the output of the input buffer circuit 48 and transmits a set of output signals. As discussed in further detail below, the eye monitor output signals correspond to the timing of transitions of the output of the input buffer circuit 48, to the calibration control circuit 46 on a N bit wide bus Q[N:0].

Still referring to FIG. 3, the calibration control circuit 46 analyzes each bit of the signals transmitted on the bus Q[N:0] to determine how wide the timing of transitions of the output of the input buffer circuit 48 is spread with respect to the Clk. In one embodiment, the calibration control circuit 46 is a state machine. It should be appreciated that the state machine of the calibration control circuit 46 can be implemented as a dedicated circuit or as a soft intellectual property (IP) core using programmable logic circuit in the core logic of a PLD, in one embodiment. The calibration control circuit 46 may include a counter circuit (not shown) to count the number of transitions of the output of the input buffer circuit 48. When the counter circuit counts to a pre-determined value, the calibration control circuit will reset the eye monitor to complete a measurement cycle. The calibration control circuit 46 determines the horizontal width of the eye of the output of the input buffer circuit 48 through a count of the consecutive logical one's in the output of the eye monitor circuit 54, as discussed in more detail below.

For each level of the reference voltage VREF, the horizontal width of the eye of the output of the buffer circuit 48 that corresponds to each level of the reference voltage VREF is compared through the calibration control circuit 46. Based on the comparison of the horizontal width of the eye, a level of the reference voltage VREF that produces the appropriate duty cycle of the output of the input buffer circuit 48 is determined. In one embodiment, by cycling through the various levels of the reference voltage VREF through a selection signal transmitted to multiplexer MX1 and determining the horizontal width of the eye for each level of the reference voltage VREF, the calibration control circuit 46 can calibrate the level of the reference voltage VREF to achieve a maximum horizontal width of the eye.

The adjustable reference voltage generator circuit 40 generates a number of levels of the reference voltage VREF, and in one embodiment can be implemented as a voltage divider 42, which is a number of resistors 44 connected in series between the power supply VDD and ground (GND). The voltage divider 42 provides different voltage levels at nodes $N_1$-$N_N$, any of which can be selected by the calibration control circuit 46. In one embodiment, the calibration control circuit 46 transmits a selection signal to the multiplexer MX1, which in turn selects the voltage at the corresponding node $N_1$-$N_N$ of the voltage divider 42 for output to the voltage follower 50 to provide the reference voltage VREF. Multiplexer MX1 may be referred to as a reference voltage select circuit. It should be appreciated that the embodiments are not limited to a multiplexer as other selector circuits may be integrated with the embodiments described herein. Based on the determination of the horizontal width of the eye calculated by the calibration control circuit 46, the reference voltage VREF may be adjusted to the level above or below the current level reference voltage VREF. For example, if the level of the reference voltage VREF above the current level of reference voltage VREF produces a larger horizontal width of the eye, the higher level is chosen as the current level and the next higher level of reference voltage VREF is compared to determine which level of reference voltage VREF produces the maximum horizontal width of the eye. This process continues until the maximum horizontal width of the eye is identified.

The voltage of the node $N_1$-$N_N$ selected by the multiplexer MX1 is transmitted as the reference voltage VREF to the input buffer circuit 48 after buffering by the voltage follower circuit 50. The voltage follower circuit 50 provides a low impedance driver for the reference voltage VREF, in one embodiment. The voltage divider 42 is controlled by n-type metal-oxide semiconductor (NMOS) transistor M1. It should be appreciated when input signal Enable to transistor M1 is high, e.g., a logic one value, the voltage divider 42 is operational and the reference voltage VREF is provided to the buffer circuit with an adjustable reference voltage 40. If the buffer circuit with the adjustable reference voltage 40 is not used, the input signal Enable to transistor M1 is set low, which disables the voltage divider 42.

Figure 4A:
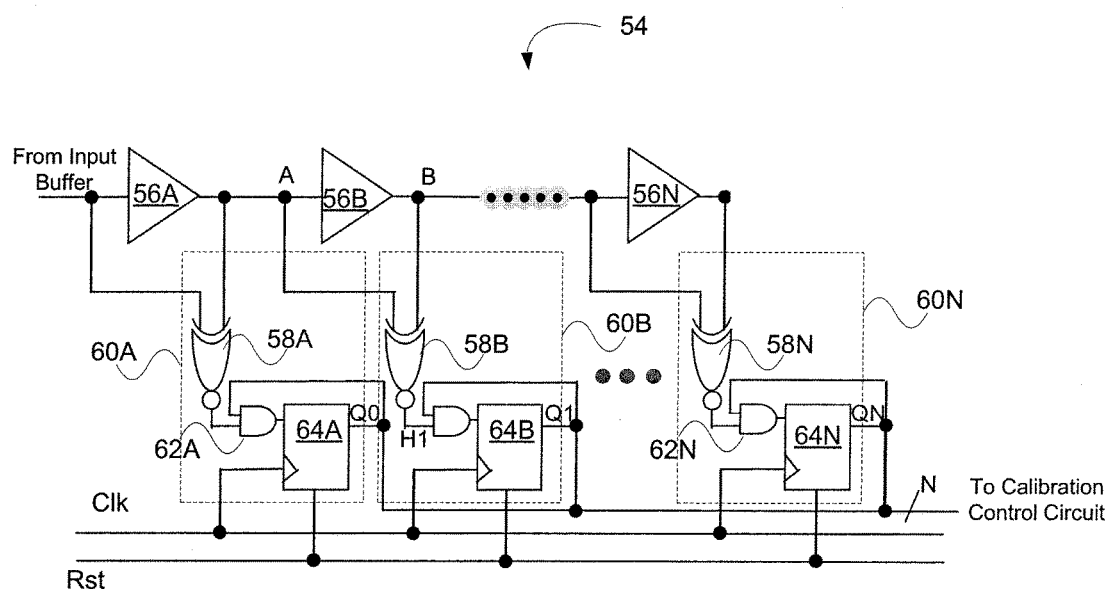
FIG. 4A illustrates an exemplary schematic of an eye monitor circuit, in accordance with one exemplary embodiment.

FIG. 4A illustrates an exemplary schematic of an eye monitor circuit, in accordance with one exemplary embodiment. As discussed above, the output of the input buffer circuit is transmitted to the eye monitor circuit 54. In one embodiment, the output of the input buffer circuit is transmitted through a series of delay elements 56A-N, such that the output of each delay element 56A-N generates a delayed version of the output of the input buffer circuit. The input and output of each of the series of delay elements 56A-N is transmitted to a respective transition detection circuit 60A-N. Each transition detection circuit 60A-N analyzes the input and output signals of the delay elements 56A-N to detect a transition of the output of the input buffer.

Still referring to FIG. 4A, in one embodiment, each transition detection circuit 60A-N includes an exclusive NOR (XNOR) gate 58A-N, a storage element 64A-N, e.g., a register, and an AND gate 62A-N. The inputs transmitted to each XNOR gate 58A-N are the input and output of the corresponding delay element 56A-N. The output of each XNOR gate 58A-N is transmitted to the input of an associated AND gate 62A-N. In addition, the output Q0-N of the each storage element 64A-N is transmitted back to the input of the associated AND gate 62A-N. In one embodiment, each transition detection circuit 60A-N receives a clock Clk and reset RST signal. The output of each AND gate 62A-N is clocked into the associated register 64A-N at the rising edge of each clock Clk cycle. The output Q0-N of each storage element 64A-N is transmitted to the calibration control circuit through the N bit wide bus Q[N:0]. It should be appreciated that the resolution of the transition detection circuit 60A-N is determined by the delay of the delay elements 56A-N. Still further, the number of transitions of the output of input buffer 48 for each measurement can be programmable for a given PLD, in one embodiment.

When a transition edge of the input data passes through the delay elements 56A-N, the output of exclusive NOR gates 58A-N switches in response to the data edge propagation. For example, when the edge of the transmitted input signal, i.e., output of the input buffer circuit, is between node A and node B, corresponding to delay element 56B, the output of the XNOR gate 58B at node H1 will be low or a logical zero. The storage elements 64A-N record the location of the transition edges of the input data at the clock Clk edge. The resolution of the eye monitor circuit depends on the delay of each delay element, i.e., a smaller delay for the delay elements 56A-N results in higher resolution of the horizontal width of the eye. It should be appreciated that lower frequency data, e.g., below 1 gigahertz, utilizes more delay elements to determine the horizontal width of the eye. It should be further appreciated that the exemplary transition detection circuit of FIG. 4A illustrates specific circuit elements and is illustrative and is not meant to be limiting as alternative logic gates or storage elements may be incorporated, as well as alternative circuit configurations that achieve the same functionality.

Figure 4C:
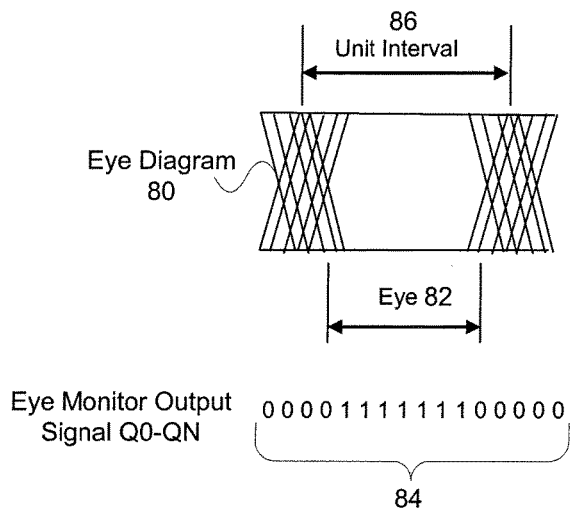
FIG. 4C illustrates an exemplary relationship between the output of the eye monitor circuit and the resultant eye diagram, in accordance with one exemplary embodiment.
Figure 4B:
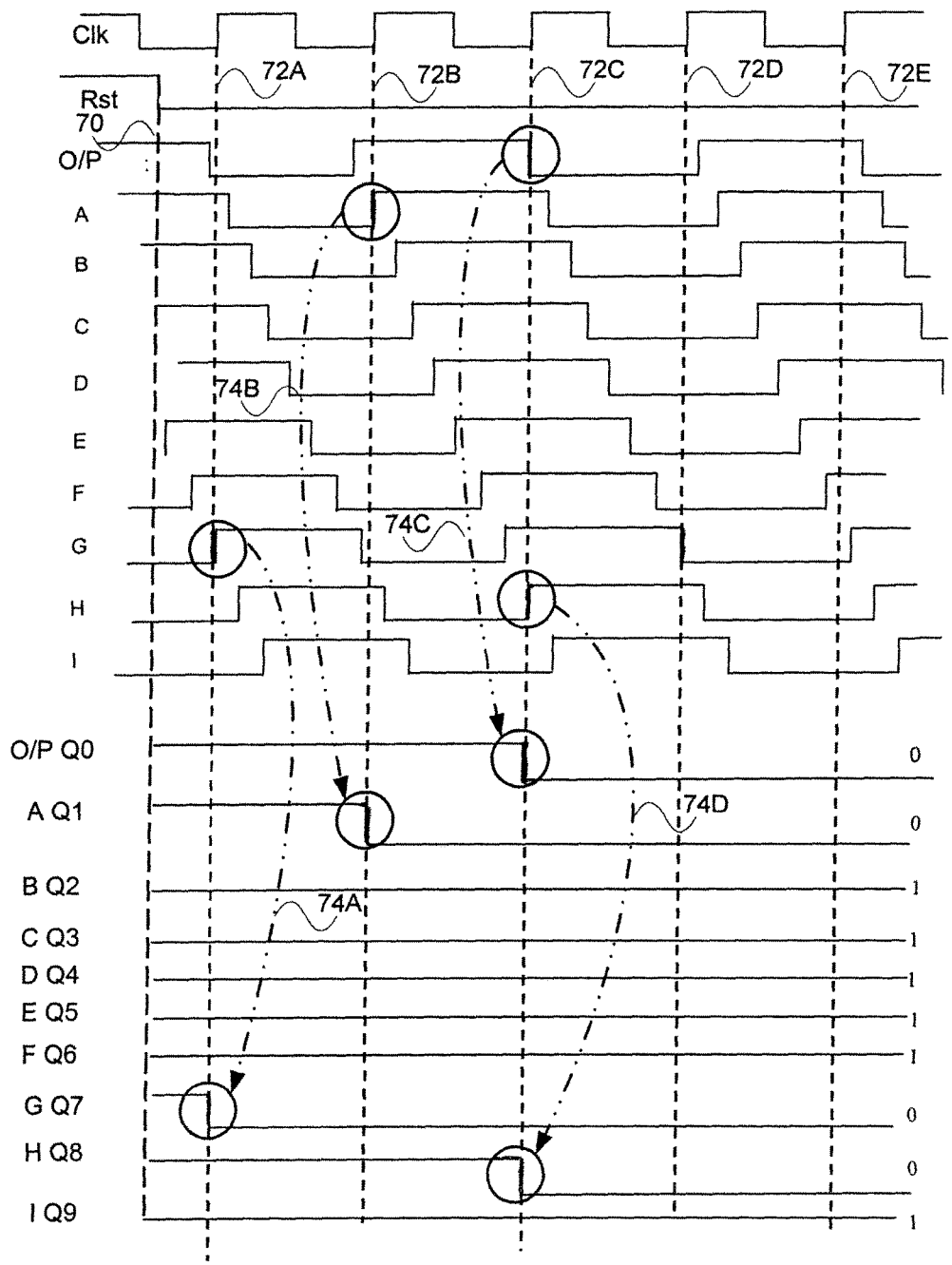
FIG. 4B illustrates exemplary waveforms of an eye monitor circuit, in accordance with one exemplary embodiment.

FIG. 4B illustrates exemplary waveforms of an eye monitor circuit, in accordance with one exemplary embodiment. Referring to both FIGS. 4A and 4B, waveform O/P is the output from the input buffer circuit and waveforms A-I are the exemplary output of each delay element. In other words, waveforms A-I are delayed versions of the output O/P of the input buffer circuit illustrated in FIG. 3. The corresponding output of the storage elements are illustrated by waveforms Q0-9. During the reset operation 70, the output Q0-9 of the storage elements is reset to a logical one. At the rising edge of each clock cycle 72A-E, the transition detection circuit analyzes each waveform O/P and A-I to determine if there is a transition at the clock edge in any of the waveforms O/P and A-I transmitted to the transition detection circuits. When a transition of waveforms O/P and A-N is detected, the output Q0-9 of the corresponding storage element, or register, is set low, i.e., a digital zero, and remains low until the transition detection circuit is reset. In the case where waveforms O/P and A-N do not undergo a transition during a clock edge, the output Q0-9 of the corresponding storage element remains high, i.e., a digital one.

For example, at the rising edge 72A of clock cycle Clk, waveform G undergoes a transition 74A at the clock Clk edge, which results in the output waveform Q7 that goes from high to low at rising edge 72A. Similarly, waveform Q1 has a transition 74B at rising edge 72B of clock cycle Clk, and waveforms Q0 and Q8 have transitions 74C and 74D at clock cycle 72C, respectively. In the case where the waveforms B-F do not have a transition at a clock Clk edge, the waveforms Q2-Q6 remain high after a specified number of transitions of the clock Clk edge. After the width of the horizontal eye is measured, the storage elements are reset, and the eye monitor circuit is ready to determine the horizontal width of the eye for another level of the reference voltage.

FIG. 4C illustrates an exemplary relationship between the output of the eye monitor circuit and the resultant eye diagram, in accordance with one exemplary embodiment. An eye diagram 80 is generated from a number of voltage samples taken over a period of time that provides an indication of the quality of the data. If displayed, the data forms a pattern with an open area resembling the shape of an eye 82 of FIG. 4C. The eye diagram 80 is bounded at the top and bottom by the high and low voltage levels of the data, respectively. The two sides of the eye diagram 80 correspond to high-to-low transitions of the data and low-to-high transitions of the data. In this embodiment, the input data is the output of the input buffer and the high and low voltages correspond to the voltages of the output of the input buffer, as illustrated in FIG. 2.

As discussed above, the horizontal width of the eye 82 of FIG. 4C is an indicator of the system performance. For example, the horizontal width of the eye 82 can be an indicator of the sampling margin, and in turn an indicator of the bit error ratio. The horizontal width of the eye 82 is determined by the percentage of the unit interval 86 where the amplitude of the measured data stays above or below the reference voltage or sampling threshold. The unit interval 86 is defined as the ideal time between two adjacent signal transitions of the output of the input buffer that is determined by the clock period. In one embodiment, the measured data is the input data transmitted to the data input of the buffer circuit, as illustrated in FIG. 3. As discussed in FIG. 4A, the eye monitor output signal 84 from the transition detection circuit indicates timing spread of transitions of the output of the input buffer circuit. The transitions of the output of the input buffer in turn correlate with the transitions that make up the sides of the eye 82, as discussed above. Since each bit of eye monitor output signal 84 has a different amount of delay and represents a different, specific location of the transition of the input buffer output in a clock period, the value of the bits of eye monitor output signal 84 corresponds to the timing spread of the transitions of the input buffer output with respect to the clock Clk As illustrated in FIG. 4C, the eye monitor signal 84 is representative of the horizontal width of the eye 82 opening. In one embodiment, the horizontal width of the eye 82 can be measured through the calibration control circuit by counting the number of consecutive logical one's in the eye monitor output signal 84.

Figure 5:
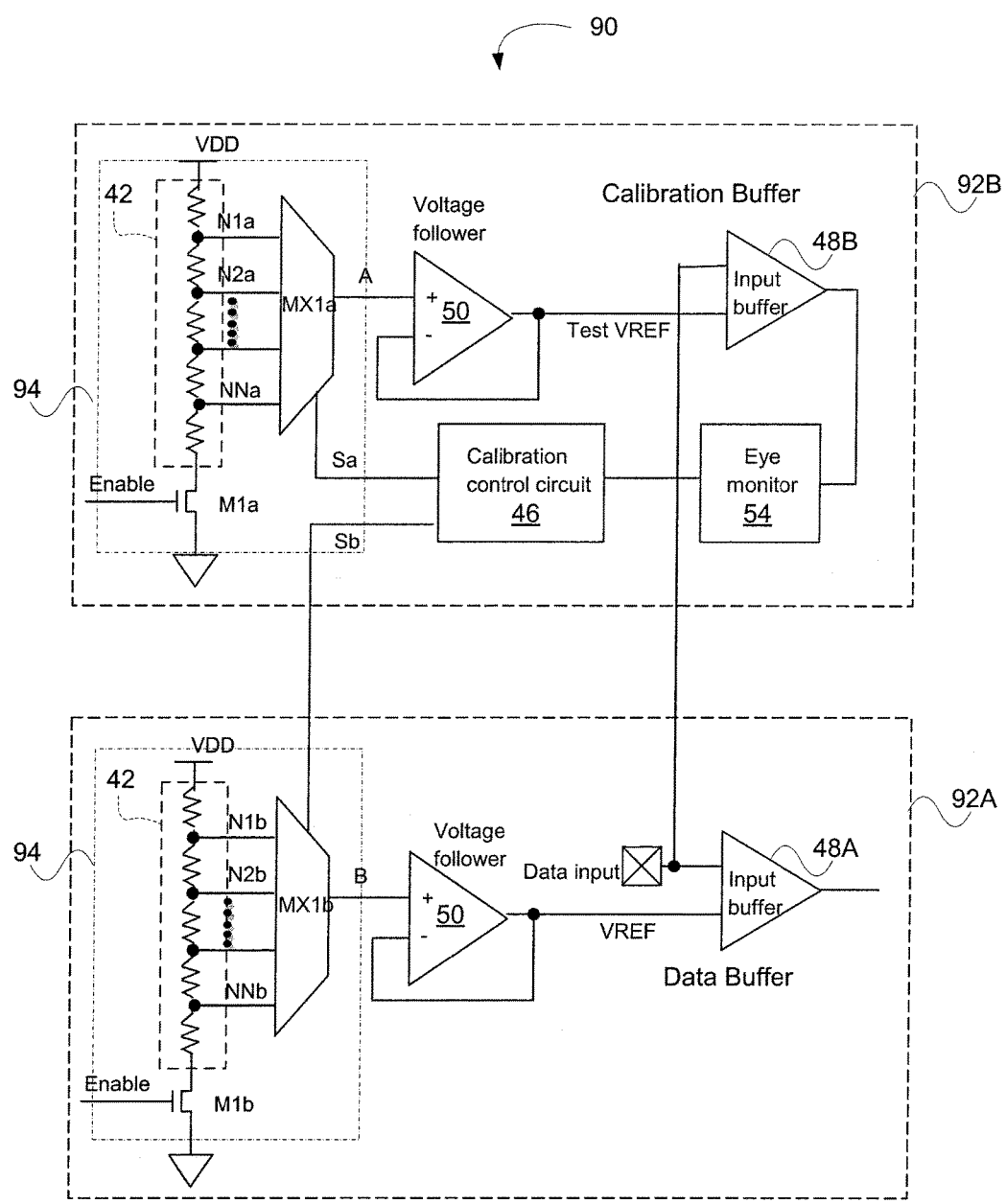
FIG. 5 illustrates an exemplary buffer circuit with a continuously self-calibrating reference voltage, in accordance with one exemplary embodiment.

FIG. 5 illustrates an exemplary buffer circuit with a self-calibrating reference voltage, in accordance with one exemplary embodiment. The buffer circuit with a self-calibrating reference voltage 90 includes calibration buffer circuit 92B and a data buffer circuit 92A. In one embodiment, the data buffer circuit 92A provides input data to core logic of the integrated circuit, while the calibration buffer circuit 92B acts as a "duplicate" input buffer circuit, and functions to contemporaneously calibrate the reference voltage VREF of the reference voltage generator circuit 94 while the data buffer circuit 92A provides input data to the core logic. Each of the calibration buffer circuit 92B and the data buffer circuit 92A includes an input buffer circuit 48B and 48A, respectively, along with a reference voltage generation circuit 94, in one embodiment.

Each reference voltage generation circuit 94 includes a voltage divider 42, multiplexer MX1$a$ and MX1$b$, and voltage follower 50, as discussed in FIG. 3. In one embodiment, the calibration control circuit 46 continuously scans the reference voltage Test VREF of calibration buffer circuit 92B at the level above and below the reference voltage VREF of the data buffer circuit 92A. The output of the input buffer 48B of the calibration input buffer circuit 92B is monitored by the eye monitor circuit 54 of the calibration input buffer circuit 92B. As discussed in FIG. 3, output signals of eye monitor circuit 54 are transmitted to the calibration control circuit 46, which analyzes the signals to determine the level of reference voltage Test VREF that produces the maximum horizontal width of eye of the input data from 48B. Based on the determination of the horizontal width of the eye, the reference voltage Test VREF of calibration buffer circuit 92B may be adjusted to the level above or below the reference voltage VREF of the data buffer circuit 92A.

For example, if the level of the reference voltage Test VREF above the current level of reference voltage VREF produces a larger horizontal width of the eye, the higher level will be selected as the current level, and the next higher level of reference voltage Test VREF subsequently tested. Based on the comparison of the resulting horizontal widths, the level of reference voltage Test VREF producing the maximum horizontal width of the eye is determined. Periodically the selection signal Sa to the multiplexer MX1$a$ of the calibration input buffer circuit 92B which results in the maximum horizontal width of the eye for reference voltage Test VREF level is used to generate the selection signal Sb transmitted to multiplexer MX1$b$. In other words, selection signal Sb corresponds to the level of the reference voltage VREF that produces the maximum horizontal eye width of the output of the input buffer 48A of the data buffer circuit 92A based on the calibration of the reference voltage Test VREF, as discussed above. It is appreciated that the embodiment of FIG. 5 with the duplicated input buffer and duplicated VREF generator enables the contemporaneous performance of calibration and receiving data. That is data buffer circuit 92A can receive data while calibration buffer circuit 92B performs the calibration, as opposed to the embodiment of FIG. 3 where the calibration and receiving data are performed sequentially.

Figure 6:
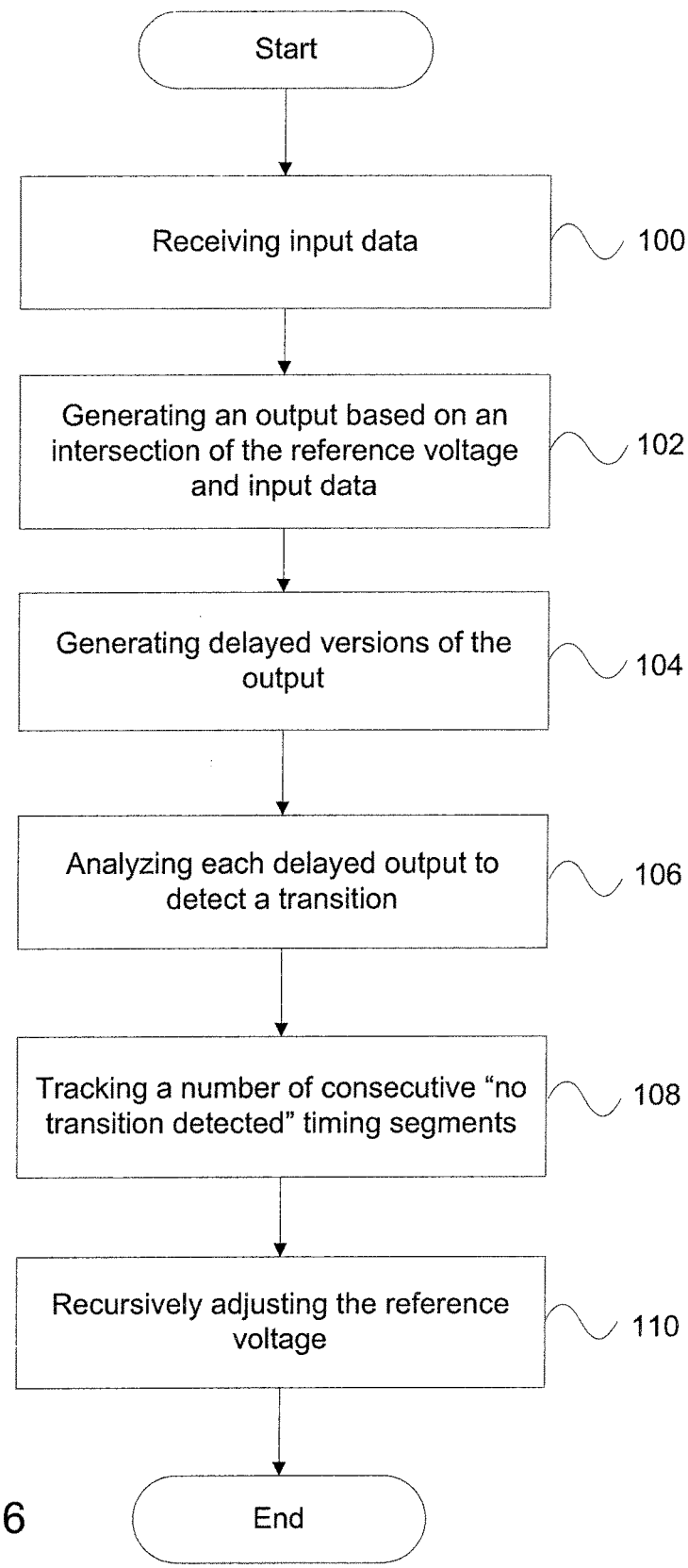
FIG. 6 is a flow chart diagram illustrating method operations for calibrating a reference voltage, in accordance with one exemplary embodiment.

FIG. 6 is a flow chart diagram illustrating method operations for calibrating a reference voltage, in accordance with one exemplary embodiment. The method begins in operation 100 where input data is received. The method advances to operation 102, where an output is generated by the intersection of the reference voltage and the input data. As discussed in FIG. 2, the duty cycle of the output is directly affected by the level of the reference voltage. In one embodiment, the output is the output of an input buffer circuit that is transmitted to the core logic of a PLD as illustrated in FIG. 3. In operation 104, delayed versions of the output are generated. In one embodiment, the delayed versions of the output are generated by transmitting the output of an input buffer through a series of delay elements, as illustrated in FIG. 4A.

Operation 106 analyzes each delayed version of the output to detect a transition. As discussed in FIGS. 3 and 4C, in one embodiment, a transition detection circuit of an eye monitor circuit analyzes each delayed version of the output to determine if the associated output has a transition that occurs during a clock edge. Still further, the eye monitor circuit transmits an output signal indicating that a transition of the associated delayed version of the input buffer output occurred at a clock edge, in one embodiment. In operation 108, the number of consecutive "no transition detected" timing segments of the output is tracked. As discussed in FIG. 3, the output signal from the eye monitor circuit is transmitted to a calibration control circuit that tracks the timing spread of transitions, by counting the consecutive logical ones in the eye monitor output, as illustrated in FIG. 4C. It is appreciated that in another embodiment, the number of consecutive bits where no transition is detected is tracked by the calibration circuit. That is, the "no-transition" timing segments determine the width of data eye. The method advances to operation 110, where the reference voltage is recursively adjusted to identify a reference voltage that maximizes the number consecutive logical ones in the output signal of the eye monitor.

It is appreciated that the reference voltage that maximizes the number of consecutive logical ones without a transition, minimizes the timing spread of transitions of the output with respect to a clock period. The consecutive logical ones in the bit stream may be referred to as "no transition detected" timing segments of the bit stream in the output signal of the eye monitor. Thus the embodiments minimize the timing spread of the input buffer output by minimizing the number of "transition detected" timing segments in the eye monitor output. The number of consecutive logical ones in the eye monitor output bit stream is correlated to the horizontal width of the eye of the input buffer output, and in one embodiment, as discussed in FIG. 4C, a higher number of logical zeros in the output of the eye monitor circuit is correlated to a smaller horizontal eye width. In another embodiment, the calibration control circuit transmits a selection signal to a multiplexer to select a level of the reference voltage generated by a voltage divider, as discussed in FIG. 3. The calibration control circuit cycles through the different levels of the reference voltage to determine the level of the reference voltage that maximizes the number of consecutive logical ones in the output of the eye monitor.

The method and apparatus described herein may be incorporated into any suitable circuit, including processors and programmable logic devices (PLDs). The PLDs can include programmable array logic (PAL), programmable logic arrays (PLAs), field programmable logic array (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the PLDs owned by the assignee.

The embodiments may be practiced with other computer system configurations including hand-held devices, microprocessor systems, microprocessor-based or programmable consumer electronics, minicomputers, mainframe computers and the like. The embodiments may also be practiced in distributing computing environments where tasks are performed by remote processing devices that are linked through a network.

With the above embodiments in mind, it should be understood that the embodiments may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the embodiments are useful machine operations. The embodiments also relate to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The embodiments can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

Although the foregoing embodiments have been described in some detail for purposes of clarity of understanding, it will be apparent that certain changes and modifications can be practiced within the scope of the appended claims. Accordingly, the embodiments are to be considered as illustrative and not restrictive, and the embodiments are not to be limited to the details given herein, but may be modified within the scope and equivalents of the appended claims.

What is claimed is:

1. A calibration buffer circuit coupled to a first input buffer and a first reference voltage select circuit of a data buffer circuit, the first reference voltage select circuit coupled to a first voltage divider circuit, the calibration buffer circuit monitoring a number of transitions of an output of a second buffer circuit contemporaneously with transmission of the output of the first input buffer of the data buffer circuit, the calibration buffer circuit comprising:
    the second input buffer coupled to a data input and a test reference voltage, with the test reference voltage derived separate from a reference voltage;
    an eye monitor circuit coupled to the second input buffer, the eye monitor circuit generating an output signal representative of a timing of the transitions of the output of the second input buffer with respect to a clock signal;
    a calibration control circuit coupled in series with the eye monitor circuit, the calibration control circuit receiving the output signal from the eye monitor circuit, and the calibration control circuit analyzing the output signal from the eye monitor circuit and providing a selection signal to the first reference voltage select circuit of the data buffer circuit, wherein the selection signal corresponds to the level of the reference voltage that produces a maximum horizontal width of an eye of the output of the first input buffer of the data buffer circuit based on a calibration of the test reference voltage;
    a second reference voltage select circuit coupled to the calibration control circuit, the second reference voltage select circuit transmitting the test reference voltage to the second input buffer; and
    a second voltage divider circuit coupled to the second reference select circuit, the second voltage divider circuit having a series of resistors equivalent to the first voltage divider circuit.

2. The calibration buffer circuit of claim 1, wherein the second reference voltage select circuit comprises a multiplexer.

3. The calibration buffer circuit of claim 1, wherein an output signal of each of a plurality of transition detection circuits in the eye monitor circuit has a first logical state in response to the transition and a second logical state in response to a lack of the transition.

4. The calibration buffer circuit of claim 1, wherein each of a plurality of transition detection circuits in the eye monitor circuit further comprises:
    a first comparison circuit, having no latching, coupled to both an unlatched input and an unlatched output of an associated delay element of a plurality of delay elements coupled to receive an output of the calibration buffer circuit; and a storage element coupled to an output of a second logic gate, wherein an input of the second logic gate is coupled to an output of the storage element and an output of the first comparison circuit.

5. The calibration buffer circuit of claim 1, wherein a resolution of the level of the reference voltage is determined by a number of resistors of the first voltage divider circuit.

6. The calibration buffer circuit of claim 1, wherein the first voltage divider circuit further comprises:

an enable circuit that enables the first voltage divider circuit to generate a plurality of levels of the reference voltage.

7. The calibration buffer circuit of claim 1, further comprising:

a voltage follower circuit coupled to the second reference voltage select circuit and to an input buffer circuit.

8. The calibration buffer circuit of claim 4, wherein a resolution of the eye monitor circuit depends on a number of the plurality of delay elements.

9. The calibration buffer circuit of claim 1, wherein the calibration control circuit further comprises:

a counter circuit that tracks a number of consecutive bits of the output signal of the eye monitor circuit without a transition.

10. A circuit with a continuously self-calibrating reference voltage comprising:

a data buffer circuit comprising:

a first input buffer coupled to a data input and a reference voltage, the first input buffer transmitting an output in response to a comparison between a voltage level of the input data and a voltage level of the reference voltage, and a first reference voltage select circuit coupled to a first voltage divider circuit, the first reference voltage select circuit selecting a level of the reference voltage from the first voltage divider circuit based on a selection signal; and a calibration buffer circuit coupled to the first input buffer and the first reference voltage select circuit of the data buffer circuit, the calibration buffer circuit monitoring a number of transitions of an output of a second input buffer contemporaneously with transmission of the output of the first input buffer of the data buffer circuit, wherein the calibration buffer circuit comprises:

the second input buffer coupled to the data input and a test reference voltage, with the test reference voltage derived separate from the reference voltage;

an eye monitor circuit coupled to the second input buffer, the eye monitor circuit generating an output signal representative of timing of the transitions of the output of the second input buffer with respect to a clock signal;

a calibration control circuit coupled in series with the eye monitor circuit, the calibration control circuit receiving the output signal from the eye monitor circuit, the calibration control circuit analyzing the output signal from the eye monitor circuit and providing a selection signal to the first reference voltage select circuit of the data buffer circuit, wherein the selection signal corresponds to the level of the reference voltage that produces a maximum horizontal width of an eye of the output of the first input buffer of the data buffer circuit based on a calibration of the test reference voltage;

a second reference voltage select circuit coupled to the calibration control circuit, the second reference voltage select circuit transmitting the test reference voltage to the second input buffer; and a second voltage divider circuit coupled to the second reference voltage select circuit, the second voltage divider circuit having a series of resistors equivalent to the first voltage divider circuit.

11. The buffer circuit of claim 10, wherein the calibration control circuit periodically updating the selection signal based on the number of consecutive bits without a transition in the output signal of the eye monitor circuit.

12. The buffer circuit of claim 10, wherein the calibration control circuit generates a selection signal to the second reference voltage select circuit to select a level of the test reference voltage.

* * * * *